United States Patent
Rose et al.

(10) Patent No.: US 6,774,372 B1
(45) Date of Patent: Aug. 10, 2004

(54) ELECTRON-OPTICAL LENS ARRANGEMENT WITH AN AXIS THAT CAN BE LARGELY DISPLACED

(75) Inventors: Harald Rose, Darmstadt (DE); Peter Schmid, Darmstadt (DE); Roland Janzen, Darmstadt (DE)

(73) Assignee: CEOS Corrected Electron Optical Systems GmbH, Heidelberg (DE)

( * ) Notice: Subject to any disclaimer, the term of this patent is extended or adjusted under 35 U.S.C. 154(b) by 17 days.

(21) Appl. No.: 10/018,904

(22) PCT Filed: Aug. 16, 2000

(86) PCT No.: PCT/DE00/02797

§ 371 (c)(1),
(2), (4) Date: Jan. 15, 2002

(87) PCT Pub. No.: WO01/22469

PCT Pub. Date: Mar. 29, 2001

(30) Foreign Application Priority Data

Sep. 18, 1999 (DE) .......................................... 199 44 857

(51) Int. Cl.⁷ ................................................ H01J 37/26
(52) U.S. Cl. ...................................................... 250/398
(58) Field of Search ........................................ 250/398

(56) References Cited

U.S. PATENT DOCUMENTS 4,912,405 A * 3/1990 Richardson ............. 324/158 R
5,719,623 A * 2/1998 Kinoshita ................... 348/215
5,838,011 A * 11/1998 Krijn et al. ............. 250/396 R
6,184,975 B1 * 2/2001 Henstra et al. ............. 356/123

* cited by examiner

Primary Examiner—John R. Lee
Assistant Examiner—Phillip A Johnston
(74) Attorney, Agent, or Firm—Edwin D. Schindler

(57) ABSTRACT

An electron-optical lens arrangement with an axis that can be substantially displaced, and useful for electron lithography, includes a cylinder lens and a quadrupole field. The plane of symmetry of the quadrupole field extends in the mid-plane of the gap pertaining to the cylinder lens. The focussing level of the quadrupole is oriented in the direction of the gap. The amount of the focussing refractive power belonging to the cylinder lens is twice as high as the amount of the quadrupole. A deflection system for the charged particles is connected upstream in the level of the gap pertaining to the cylinder lens and several electrodes or pole shoes, which generate a quadrupole field are provided in the direction of the gap pertaining to the cylinder lens. The electrodes or pole shoes can be individually and, preferably, successively excited and the quadrupole field can be displaced according to the deflection of the particle beam, so that the particle beam impinges upon the area of the quadrupole field. A holding device is provided for an object, such as a wafer, and is arranged vertically in relation to the optical axis and can be displaced in relation to the direction of the gap pertaining to the cylinder lens.

12 Claims, 2 Drawing Sheets

ELECTRON-OPTICAL LENS ARRANGEMENT WITH AN AXIS THAT CAN BE LARGELY DISPLACED

BACKGROUND OF THE INVENTION

1. Technical Field of the Invention

Figure 1:
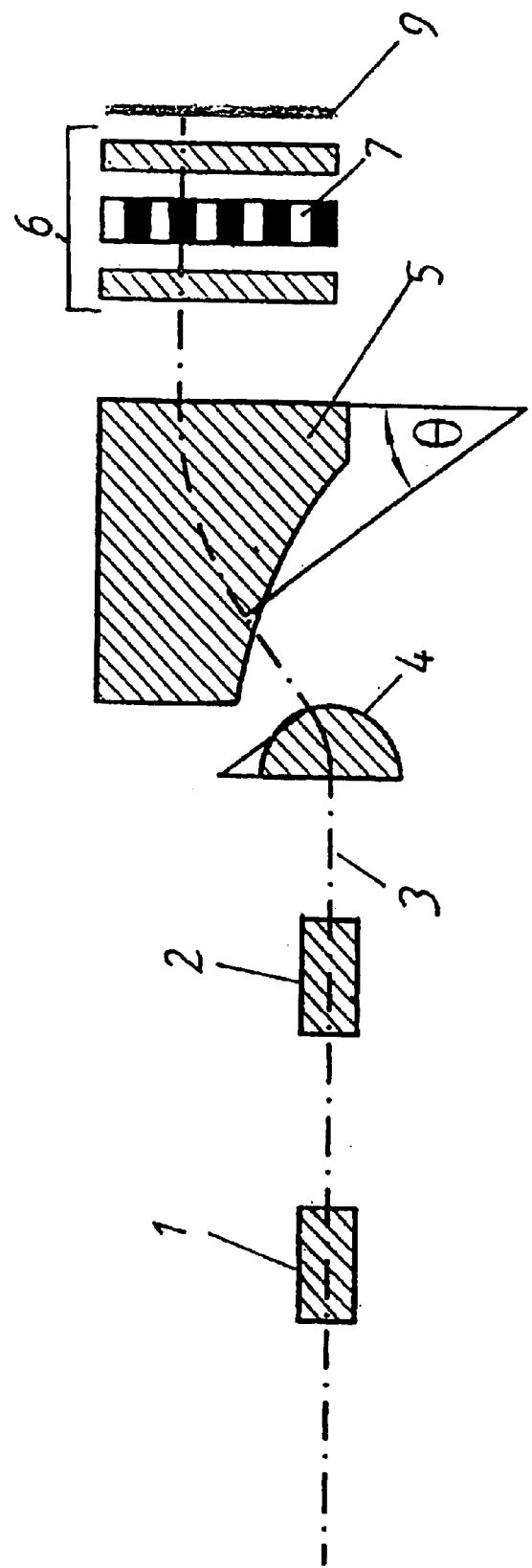

The invention relates to an electron-optical lens arrangement with an axis that can be largely displaced, especially for electron lithography, with a cylinder lens and a quadrupole field, the plane of symmetry of said quadrupole field extending in the mid-plane of the gap pertaining to the cylinder lens, the focussing plane of the quadrupole being aligned in the direction of the gap, and the magnitude of the focussing refractive power belonging to the cylinder lens being twice as high as that of the quadrupole.

2. Description of the Prior Art

One of the main fields of application of electron beam lithography is the production of electronic components and integrated circuits on the surface of disc-shaped semiconductor crystals (wafers). Their desired miniaturisation requires the writing of structures of the smallest possible size. The decisive advantage over optical lithography consists in the fact that the wavelengths of the electrons are much smaller that those of light, and therefore allow the reproduction of smaller structures. Furthermore, electron-beam writers have the capability of recording very small structures, but compared with light-optical projects have the disadvantage of a longer exposure time and of the requirements for production of a good vacuum and for a table that can be rapidly and precisely moved in the image plane; this demand results from the fact that known electron-optical deflection elements are only capable of error-free deflection of the beam within the millimeter range. For this reason, electron-beam lithography has until now been used primarily for the production of masks for optical lithography and for the production of custom chips, in which the required time is of secondary importance.

Goto and Somo, published in the journal "Optik" 48, 255–270 MOL (moving object lense), 1977, proposed overlaying the circular lens field with deflection fields, by means of which the image field can be enlarged, which is not sufficient to obtain an image field of the extent of a wafer, so that the bore diameter of the circular lens still decisively limits the useable image field. In addition, a workpiece holding device that is movable two-dimensionally in a plane perpendicular to the electron beam is required, with the efficiency of the system and the minimum size of the structures that can be generated depending on the accuracy of movement of this holding device; and the speed of movement of the holding device determining the maximum writing speed.

For focussing of charged particles, cylinder lenses have been disclosed (H. Rose, Optik 36, 1971, pages 19 to 36), in which the electrodes or pole shoe have a gap-shaped opening which serves to generate the electrical or magnetic field respectively, and whose longitudinal axis is aligned perpendicular to the optical axis, this longitudinal axis, together with the optical axis, spanning a plane which describes the mid-plane of the cylinder lens arrangement. A stigmatic imaging by means of the cylinder lenses is in principal impossible, since a focussing effect only takes place perpendicular to the gap direction, the movement components of the charged particles to be represented, by contrast, undergoing no deflection parallel to the gap (or vice versa). The rod-shaped astigmatic point images obtained are unsuitable for imaging. PCT/DE 97/05518 discloses an electron-optical lens arrangement, in which the cylinder lens overlays a quadrupole field and is assigned in such a way that the focussing plane of the quadrupole is aligned in the direction of the gap pertaining to the cylinder lens and consequently the defocussing plane extends perpendicular to this, with coaxial optical axes. As a result, the focussing takes place in one of the gap planes by means of the quadrupole field and in the plane extending perpendicular thereto by means of the cylinder lens, whose intensity is to be adjusted such that an elimination of the defocussing component of the quadrupole field occurs. If the focussing effect in the two planes extending perpendicular to one another is adjusted in an identical manner, the combination of the two lenses results in stigmatic images.

SUMMARY OF THE INVENTION

On this basis, the object of the invention is to provide an electron-optical lens arrangement which has a very wide operating range in one direction and the beam can also be made to impinge essentially always perpendicularly on the object even in regions distant from the centre.

This object is solved according to the invention in that a deflection system for the charged particles is connected upstream in the plane of the gap pertaining to the cylinder lens, and a plurality of electrodes or pole shoes are provided in the direction of the gap pertaining to the cylinder lens, which generate a quadrupole field and can be individually and preferably successively excited, and the quadrupole field is displaced corresponding to the deflection of the particle beam such that the particle beam impinges in the area of the quadrupole field, and a holding device for the object is provided, which can be displaced perpendicularly to the optical axis and to the direction of the gap pertaining to the cylinder lens.

The gist of the invention consists in connecting a deflection system upstream of the electron-optical lens arrangement, the deflection system consisting of a cylinder lens and quadrupole field and displacing the particle beam, which generally consists of electrons, essentially paraxially and in the direction of the gap pertaining to the cylinder lens, and the quadrupole field being generated in the impingement point of the particle beam within the lens arrangement. The spatial displacement of the quadrupole field is carried out by electronic means, i.e. the quadrupole field is excited in the region of the impingement point of the particle beam by actuation of the electrodes (in the case of electrical lenses) or pole shoes (in the case of magnetic lenses) that are located there. For the specific constructional implementation, basically two principles are conceivable: on the one hand the quadrupole field can be displaced discontinuously in the direction of the gap pertaining to the cylinder lens, so that with continuous displacement of the particle beam, the latter generally passes through the lens arrangement, for example outside the axis of the quadrupole field. These slight deviations from the axis of the quadrupole field are the cause of the occurrence of electron-optical image errors, which, however, because of the low deviations, are so small that they cannot significantly affect the quality of the optical representation. In addition, arrangements are also conceivable in which, synchronously with the deflection of the particle beam and therefore continuously, the quadrupole field is displaced in the direction of the gap pertaining to the cylinder lens. By a corresponding adjustment, it can be achieved that the particle beam extends exactly in the axis of the quadrupole field, so that the occurrence of image fields by virtue of the extra-axial passage of the particle beam generated by the quadrupole field is suppressed. By virtue of the fact that the generation of the quadrupole field is provided by the constructional arrangement of the electrodes or pole shoes, which require their own space and consequently are of finite extension in the direction of the gap pertaining to the cylinder lens, it is theoretically desirable to displace the quadrupole field in infinitesimally small steps, but in practice this can only be approximated. The particle beam in the proposed arrangement will also impinge on the object essentially perpendicularly and with unchanged optical image quality, even in regions distant from the object centre. It is thus possible, without quality loss, to displace the particle beam over a range delimited by the width of the gap pertaining to the cylinder lens. The result is that an exact optical reproduction along a straight line extending in the direction of the gap pertaining to the cylinder lens can be carried out. The restriction of the image field caused by the bore of the circular lenses is eliminated.

Compared with the former electron-lithography arrangements for writing on the object, in which two-dimensional displacement perpendicular to the electron beam by mechanical means was indispensable, which inevitably resulted in a considerable restriction of the effectiveness, the object can now be displaced also in a direction perpendicular to the gap pertaining to the cylinder lens, but still in a plane perpendicular to the optical axis and consequently still only one-dimensionally. A one-dimensional displacement also at low speed allows much more precise operation.

Use is essentially in a manner known per se, in that the object, which in the case of electron lithography, will often be a semiconductor wafer, is fixed so as to be mechanically displaceable one dimensionally, perpendicular to the optical axis and also to the gap pertaining to the cylinder lens. Perpendicular to this, the writing by the particle beam is carried out by means of the aforementioned electron-optical lens arrangement in a very long linear range, which extends in the direction of the gap pertaining to the cylinder lens, and along which a good stigmatic representation of all points is possible. With the above-described arrangement, with a resolution of 0.025 micrometers and an axial spacing of 5 mm, a distortion-free image can be produced. As a result, a significant enlargement of the linearly reproduced region of high optical quality, which extends in the direction of the gap pertaining to the cylinder lens is obtained. Perpendicular to this, i.e. in the displacement direction of the object, the image quality will be further determined by the displacement accuracy of the mechanical system, though it should be pointed out that the one-dimensionality and slower displacement permits substantially more precise operation of the mechanical system.

Within the scope of the invention, it is in principle immaterial whether the quadrupole field and/or cylindrical field is generated electronically or magnetically. It has been recognised as expedient to choose the cylindrical field and/or in particular the quadrupole field to be displaced electrically, because then, with the avoidance of remanences and eddy currents, rapid field displacement is possible.

For the specific embodiment of the electrical quadrupole field, which is displaceable in the direction of the gap pertaining to the cylinder lens, the centre electrode of the cylinder lens is subdivided in the direction of the gap into mutually electrically isolated individual electrodes, which are individually actuatable. For displacement and for generation of the desired electrical field, the individual electrodes are successively subjected to the appropriate voltage. The successive actuation of adjacent electrodes provides the desired displacement.

For the reduction of many of the second-order image errors caused by the curved optical axis, it is preferred to choose the fields and the resulting fundamental paths so as to be symmetrical to the mid axis of the lens.

Hitherto described was an arrangement in which a single source (electron source) generates the particle beam for writing on the object and deflects it in the above-described manner. A significant enlargement of the image field in the direction of the straight line providing error-free imaging and extending in the direction of the gap pertaining to the cylinder lens can be achieved in that a plurality of the above-described arrangements are arranged parallel to one another and adjacent to one another in the direction of the gap pertaining to the cylinder lens, in the manner that the image range of adjacent arrangements overlap or are at least contiguous to one another. In the case of n similar arrangements, an n-fold image width can be obtained. Because of the possibility of synchronous operation of each individual arrangement, there remains the writing duration required by an individual arrangement.

Another possibility for reducing the writing duration can be achieved by the fact that a multiplicity of the above-described arrangements are arranged perpendicular to the direction of the gap, and thereby one above the other. By this means it is achieved that the object is written on simultaneously in a multiplicity of regions lying one behind the other in the direction of movement of the object, so that one particle beam only has to cover a single partial range. The displacement of the object must only take place such that the beam only covers the range assigned to it.

The deflection systems acting in the gap plane of the cylinder lens and connected upstream thereof should ensure, as far as possible, perpendicular impingement on the object, that is to say the particle beam should be displaced in a paraxial manner. For this reason, it is advisable to construct the deflection system from two elements, which are arranged one behind the other in the direction of the particle beam and deflect in two opposing directions, that is to say the beam is deflected away from the optical axis in the first element and in the second element oriented in a paraxial direction. In this case, the spatial arrangement of the elements with respect to one another and with respect to the cylinder lens is in principle immaterial. A simple constructional implementation could consist in arranging the second element in the entrance region of the cylinder lens by mounting a dipole. It is important with different deflections to ensure the paraxiality of the beam. In the most general case, the question of the implementation of the deflection, be it by electrical or magnetic fields, is in principle immaterial.

DETAILED DESCRIPTION OF THE DRAWING FIGURE AND PREFERRED EMBODIMENTS

As regards the deflection system connected upstream of the lens arrangement, a preferred embodiment is one in which, in addition to a static magnetic field, a second magnetic field, varied with respect to time, and connected upstream of the beam path, is provided. By virtue of different application of the latter magnetic field, the particle beam is displaced so as to be paraxial in the direction of the gap pertaining to the cylinder lens.

It is advantageous to choose the form of the pole shoe of the magnetic field such that, irrespective of the deflection of the emerging particle stream by the upstream-connected magnetic field, paraxiality to the impinging particle stream is always produced.

BRIEF DESCRIPTION OF THE DRAWING FIGURE

Figure 2:
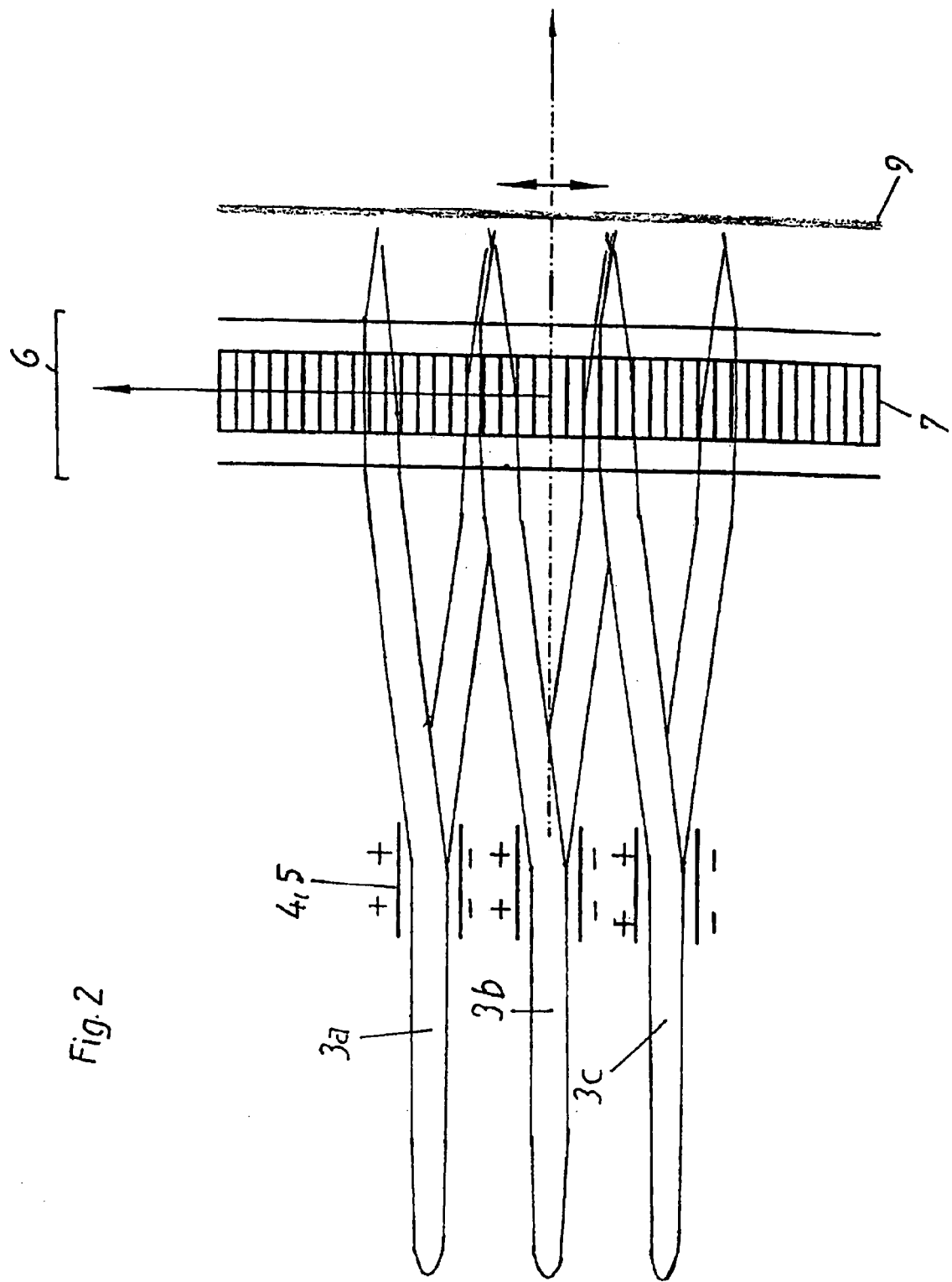

Further details, advantages and features of the invention can be taken from the following descriptive part, which describes a typical embodiment of the invention in greater detail with reference to the drawings, wherein FIG. 1 shows a schematic view of the block circuit diagram of the lens arrangement according to the invention FIG. 2 shows n arrangements adjacent to one another in the direction of the gap of cylinder lens.

The lens arrangement shown in FIG. 1 can be subdivided into three regions according to its basic construction:

The particle stream proceeds from elements which generate the charged particles, e.g. the electrons—this takes place in element 1—and then focuses them to produce a beam (element 2). Herein, the optical axis (3) showing a curved path is shown by a dot-dash line.

The region of particle generation is followed by the deflection, which, in the direction of the beam path, comprises a first magnetic field (4) and a second magnetic field (5) contiguous to the first, a different deflection being generated by variation of the magnetic field intensity and an essentially paraxial alignment of the particle beam being produced by the other, static magnetic field (5). As a result, by virtue of the deflection system (4, 5), an adjustable paraxial offset, which is adjustable in its distance from the mid-axis, is produced. The actual imaging takes place in the last region, which is constructed of a cylinder lens (6) with a centre electrode (7) designed as a comb-shaped lens. By successive application of a voltage of appropriate magnitude to the individual electrodes, a quadrupole field can be generated at different points. The actuation must take place in such a way that a quadrupole field is excited in the incident point of the particle beam with such an intensity that focussing of the plane extending in the direction of the gap to the image point occurs, and in the plane extending perpendicular to this focussing on the same image point also takes place by virtue of the overlaying of the field of cylinder lens and quadrupole and appropriate adjustment of the cylindrical field, so that stigmatic imaging takes place. By successive deflection of the particle stream and corresponding displacement of the quadrupole field, stigmatic imaging is possible in a straight line extending over the entire width of the gap. To obtain planar writing on the object (9) designated "wafer", this must be displaced in a plane extending perpendicular to the optical axis, specifically perpendicular to the direction of the gap. In comparison to the state of the art, one-dimensional and relatively slow displacement of the object is now necessary.

FIG. 2 shows a lens arrangement with three devices of the above described type arranged parallel to one another. Three bundles (3a, 3b, 3c) are drawn, which are displaced in the direction of the gap pertaining to the cylinder lens by a deflector system (4, 5), which is characterised as a capacitor. Herein, the fields are contiguous. The cylinder lens (6) consists of a comb-shaped centre electrode (7) which are charged successively and individually to generate quadrupole fields. In contrast to the arrangement described in FIG. 1, the particle stream is inclined slightly with respect to the optical axis through the cylinder lens arrangement. In a known manner, the particle stream then impinges on the object (9) designated "wafer". As a result, a writable image field is produced, which with n arrangements results in an image field which corresponds to n times the scanning region of a single lens arrangement. The result is a further enlargement of the image field in the direction of the gap pertaining to the cylinder lens.

What is claimed is:

1. An electron-optical lens arrangement with an axis capable of being substantially displaced, comprising:

a cylinder lens;

electrodes or pole shoes for generating a quadrupole field, said quadrupole field having a plane of symmetry extending in a mid-plane of a gap pertaining to said cylinder lens, said electrodes or said pole shoes being provided in a direction of said gap pertaining to said cylinder lens and being individually excitable;

a focussing plane of said quadrupole field being aligned in the direction of said gap, with a magnitude of focussing refractive power of said cylinder lens being twice as high as that of said quadrupole field;

a deflection system for charged particles being connected downstream in the plane of said gap pertaining to said cylinder lens, said quadrupole field being displaceable according to a paraxial deflection of a particle beam, so that the particle beam impinges in an area of said quadrupole field; and, means for holding an object, said means for holding being displaceable perpendicularly relative to an optical axis of, and relative to the direction of said gap pertaining to, said cylinder lens.

2. The electron-optical lens arrangement with an axis capable of being substantially displaced according to claim 1, wherein said electrodes or pole shoes are both individually and successively excitable.

3. The electron-optical lens arrangement with an axis capable of being substantially displaced according to claim 1, wherein said cylinder lens is electrical.

4. The electron-optical lens arrangement with an axis capable of being substantially displaced according to claim 1, wherein said quadrupole field is electrical.

5. The electron-optical lens arrangement with an axis capable of being substantially displaced according to claim 1, wherein said cylinder lens includes a center electrode, which is subdivided in the direction of the gap into individual regions which are electrically insulated from one another and individually actuatable.

6. The electron-optical lens arrangement with an axis capable of being substantially displaced according to claim 5, wherein said center electrode of said cylinder lens is comb-shaped.

7. The electron-optical lens arrangement with an axis capable of being substantially displaced according to claim 1, wherein electrical fields or magnetic fields extend symmetrically relative to a center plane of said cylinder lens.

8. The electron-optical lens arrangement with an axis capable of being substantially displaced according to claim 1, wherein a plurality of said electron-optical lens arrangements are positioned adjacent to one another and contiguous to one another in the direction of the gap pertaining to the cylinder lens.

9. The electron-optical lens arrangement with an axis capable of being substantially displaced according to claim 1, wherein a plurality of said electron-optical lens arrangements are positioned vertically one above another relative to the direction of the gap.

10. The electron-optical lens arrangement with an axis capable of being substantially displaced according to claim 1, wherein said deflection system comprises a first element and a second element with said first element arranged beyond said second element in the direction of the particle beam, said first element and said second element deflect, in opposite directions for producing said paraxial deflection of the particle beam.

11. The electron-optical lens arrangement with an axis capable of being substantially displaced according to claim 1, wherein said deflection system comprises a first magnetic field, being a static magnetic field, and a second magnetic field, and is connected upstream in a direction of ray impingement and is variable with respect to time.

12. The electron-optical lens arrangement with an axis capable of being substantially displaced according to claim 11, wherein said static magnetic field has a pole shoe, with the form of said pole shoe being chosen so that, independent of deflection, an emerging particle stream travels parallel to an incident particle stream.

* * * * *